(12) United States Patent
Pretscher et al.

(10) Patent No.: US 11,443,969 B2
(45) Date of Patent: Sep. 13, 2022

(54) AUTOMATED SUBSTRATE HOLDER LOADING DEVICE

(71) Applicant: Atotech Deutschland GmbH, Berlin (DE)

(72) Inventors: Rüdiger Pretscher, Berlin (DE); Daniel Buchberger, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 381 days.

(21) Appl. No.: 16/489,392

(22) PCT Filed: Feb. 19, 2018

(86) PCT No.: PCT/EP2018/054024
§ 371 (c)(1),
(2) Date: Aug. 28, 2019

(87) PCT Pub. No.: WO2018/166757
PCT Pub. Date: Sep. 20, 2018

(65) Prior Publication Data
US 2020/0006107 A1 Jan. 2, 2020

(30) Foreign Application Priority Data
Mar. 16, 2017 (EP) .................................. 17161434

(51) Int. Cl.
| H01L 21/677 | (2006.01) |
| B65G 47/91 | (2006.01) |
| C25D 17/06 | (2006.01) |
| H01L 21/67 | (2006.01) |
| H01L 21/683 | (2006.01) |
| H01L 21/687 | (2006.01) |
| H02K 7/116 | (2006.01) |
| H02K 37/24 | (2006.01) |

(52) U.S. Cl.
CPC ........ *H01L 21/67769* (2013.01); *B65G 47/91* (2013.01); *C25D 17/06* (2013.01); *H01L 21/6723* (2013.01); *H01L 21/67766* (2013.01); *H01L 21/67778* (2013.01);
(Continued)

(58) Field of Classification Search
None
See application file for complete search history.

(56) References Cited

U.S. PATENT DOCUMENTS

| 5,753,133 A | 5/1998 | Wong et al. |
| 7,802,920 B2 | 9/2010 | Sato et al. |

(Continued)

FOREIGN PATENT DOCUMENTS

| EP | 3530981 A1 * | 8/2019 | ............... F16H 1/16 |
| JP | 2007-073540 A | 3/2007 | |

OTHER PUBLICATIONS

PCT/EP2018/054024; PCT International Search Report and Written Opinion of the International Searching Authority dated Apr. 18, 2018.
(Continued)

*Primary Examiner* — Michael S Lowe
(74) *Attorney, Agent, or Firm* — Renner, Otto, Boisselle & Sklar, LLP (57) ABSTRACT

The present invention refers to a substrate holder loading device to be used in a clean room and a clean room treatment device containing such substrate holder loading device. Furthermore, the present invention refers to a method of loading a substrate holder with a first substrate, more preferably with a first and a second substrate.

7 Claims, 3 Drawing Sheets

(52) U.S. Cl.
CPC .... *H01L 21/6838* (2013.01); *H01L 21/68707* (2013.01); *H02K 7/1166* (2013.01); *H02K 37/24* (2013.01)

(56) References Cited

U.S. PATENT DOCUMENTS

| | | | |
|---|---|---|---|
| 8,309,374 B2* | 11/2012 | Porthouse | H01L 21/67213 |
| | | | 414/217 |
| 9,222,192 B2 | 12/2015 | Rauenbusch et al. | |
| 10,014,163 B2* | 7/2018 | Waugh | H01J 37/3405 |
| 10,407,793 B2 | 9/2019 | Fendel et al. | |
| 2003/0012885 A1 | 1/2003 | Gramarossa et al. | |
| 2006/0049038 A1 | 3/2006 | Griego et al. | |
| 2008/0156351 A1* | 7/2008 | Mitsuyoshi | H01L 21/67754 |
| | | | 134/137 |
| 2008/0251473 A1 | 10/2008 | Rebstock et al. | |
| 2009/0081014 A1* | 3/2009 | Contes | H01L 21/67369 |
| | | | 414/411 |
| 2011/0263133 A1* | 10/2011 | Hara | H01L 21/6838 |
| | | | 438/758 |
| 2013/0239722 A1 | 9/2013 | Vollner et al. | |
| 2017/0321344 A1 | 11/2017 | Fendel et al. | |

OTHER PUBLICATIONS

Search Report for corresponding Japanese Application No. 2019-550850 dated Feb. 14, 2022.

* cited by examiner

AUTOMATED SUBSTRATE HOLDER LOADING DEVICE

The present application is a U.S. National Stage Application based on and claiming benefit and priority under 35 U.S.C. § 371 of International Application No. PCT/EP2018/054024, filed 19 Feb. 2018, which in turn claims benefit of and priority to European Application No. 17161434.0 filed 16 Mar. 2017, the entirety of both of which is hereby incorporated herein by reference.

FIELD OF THE INVENTION

The present invention refers to an automated substrate holder loading device and a clean room treatment device containing such substrate holder loading device, preferably for electroplating. Furthermore, the present invention refers to a method of automatically loading a two-sided substrate holder.

BACKGROUND OF THE INVENTION

The usage of substrate holders is known in the art. Herein, a substrate typically providing a very sensible surface is placed in a substrate holder to especially allow an easier transportation and treatment of said substrate through at least one treatment step. Using such substrate holder highly reduces the risk of damaging the substrate and even allows to automatically process substrates being highly sensitive. For example, WO 2014053300 A1 and WO 2016096946 A1 refer to such substrate holders and their benefits.

However, such substrate loading elements provide a balance of gentle handling of the substrate and accurate placement of the substrate in the substrate holder. In case the substrate is, for example, firmly attached to the gripper and the substrate holder during handing over the substrate to the substrate holder, a very accurate placement is possible. If one or two of the aforementioned attachments is weakened, the placement becomes at least on the long term run less accurate. It was noted that applying a high quality coating on new kinds of substrates providing a highly increased sensitivity requires a new balance of accurate placement and gentle handling. Current systems seem to either fail to provide the required balance or the costs increase dramatically. Herein, multiple problems have been noted. Slowing down the placement or correcting the position multiple times highly reduces the throughput, as this step already represents a bottleneck of the processing. Accepting less accurate placement using bigger substrates and neglecting the lost untreated exterior part of the substrate represents a significant loss taking into account the high value of the treated substrates and costs of building and maintaining a clean room production. Accepting less accurate placement using normal sized substrates and receiving an incorrect placement of the electrical contacts provides an irregular electrical contacting, which typically results in significantly inhomogeneous coatings not acceptable for high quality demands. Thus, corresponding substrates have to be tested and it has to be expected that a significant amount of the substrates does not fulfill the requirements demanded by the market. Furthermore, based on the steadily increasing importance of electronics in modern society, a production system should beneficially provide a flexible handling of different substrates and substrate holders to quickly adapt to current demands and adapt the production using a minimum amount of working space in a clean room as soon as possible.

OBJECTIVE OF THE PRESENT INVENTION

Thus, it is a need to provide an improved substrate holder loading device to provide an improved balance of gentle and yet accurate handling to be prepared for new kinds of substrates, preferably being flexible to use and yet allowing a high frequency of substrates processed.

SUMMARY OF THE INVENTION

The aforementioned problems are solved by the invention as disclosed in the independent claims and the description. Further modifications providing additional benefits are included in the dependent claims and the following description. However, even further benefits not being explicitly stated herein but being immediately derivable or discernible from the connections discussed herein are solved by the present invention and its embodiments disclosed herein.

The present invention refers to a substrate holder loading device for automated horizontal loading of a substrate into a substrate holder inside of a clean room, wherein the substrate holder loading device contains a substrate holder guiding element, a drive unit, a movement mechanism, a substrate holder handling element and an opening mechanism, wherein the drive unit is connected to the movement mechanism, wherein the movement mechanism is connected to the substrate holder handling element, wherein the movement mechanism is adapted to transmit the propulsion from the drive unit to the substrate holder handling element to provide a rotation of the substrate holder handling element around an axis essentially parallel to a surface of the substrate, wherein the substrate holder handling element is adapted to rotate by around 180°, wherein the substrate holder handling element is adapted to reversibly fasten the substrate holder and wherein the substrate holder handling element contains the opening mechanism, wherein the opening mechanism is adapted to automatically open and close the substrate holder, and wherein the movement mechanism contains a stepping gear and/or wherein the drive unit is a step motor, preferably wherein the movement mechanism contains a stepping gear.

It was noted that it is especially preferred that the movement mechanism contains a stepping gear. Such movement mechanism allows to provide a reliable movement of the substrate holder handling element and to use basic drive units providing a high energy efficiency and high reliability.

The phrase "around 180°" as used herein preferably refers to an angle selected from the range from 160° to 200°, more preferred from 170° to 190°, even more from 175° to 185°. Especially, it is preferred that around 180° refers to an angle of 180°. Herein, it has to be understood that the rotation might be interrupted or it might be rotated by an angle larger than around 180° and further contain another rotation in the opposite direction to provide a total rotation by around 180°. However, it is typically preferred that the substrate holder handling element directly rotates by around 180°. Naturally, said substrate holder handling element can also rotate by less than the specified angle. Such rotation might, for example, be used to orientate the substrate holder vertically before taking the loaded substrate holder from the substrate holder loading device to a treatment bath or electroplating chamber of a clean room treatment device. Furthermore, said substrate holder handling element can also be adapted to rotate by a larger angle. However, it was noted that the provision of a substrate holder loading device adapted to provide a greater rotation was typically less beneficial due to the increase of device demands, which are typically not compensated by a corresponding benefit. In this context, it was noted that, for example, reliably providing such rotation around 180° without increasing the safety risks, avoiding contamination of the substrate, and securing the connection of especially the electrical and vacuum lines of the substrate holder handling element during rotation was quite challenging and resulted in the present invention. While outside the clean room the person skilled in the art may rely on standard means to solve these problems the high demands of the clean room eliminate many possibilities while simultaneously require finding the best balanced solution for securing the safe production without great downtimes.

Furthermore, the present invention refers to a clean room treatment device for wet treatment, preferably electroplating, wherein the clean room treatment device contains at least one inventive substrate holder loading device.

Furthermore, the present invention refers to a method of loading a substrate holder with a first substrate using an inventive substrate holder loading device.

The phrase "automatically open and close the substrate holder" as used herein refers to an automated opening and closing of the substrate holder that can be preprogrammed or triggered from the distance. For example, a treatment device can be programmed to automatically open and close the substrate holder introduced into the substrate holder loading device based on the process steps to provide a smooth and fast processing of substrates treated in said treatment device. Furthermore, it can, for example, be triggered from the outside of the treatment device by an operator during a manual run of the device to review the treatment procedure on a step-by-step basis or for troubleshooting.

BRIEF DESCRIPTION OF THE FIGURES

For a more complete understanding of the present invention, reference is made to the following Detailed Description of the Invention considered in conjunction with the accompanying figures, in which.

DETAILED DESCRIPTION OF THE INVENTION

According to an aspect the present invention refers to a substrate holder loading device for automated horizontal loading of a substrate into a substrate holder inside of a clean room, wherein the substrate holder loading device contains a substrate holder guiding element, a drive unit, a movement mechanism, a substrate holder handling element and an opening mechanism, wherein the drive unit is connected to the movement mechanism, wherein the movement mechanism is connected to the substrate holder handling element, wherein the movement mechanism is adapted to transmit the propulsion from the drive unit to the substrate holder handling element to provide a rotation of the substrate holder handling element around an axis essentially parallel to a surface of the substrate, wherein the substrate holder handling element is adapted to rotate by around 180°, wherein the substrate holder handling element is adapted to reversibly fasten the substrate holder and wherein the substrate holder handling element contains the opening mechanism, wherein the opening mechanism is adapted to automatically open and close the substrate holder, and wherein the movement mechanism contains a stepping gear and/or wherein the drive unit is a step motor, preferably wherein the movement mechanism contains a stepping gear. Examples of substrates to be loaded into a substrate holder using a substrate holder loading device as disclosed herein are platy substrates like wafers and printed circuit boards, preferably wafers.

Typically, it is preferred that the distance between the drive unit and the substrate holder handling element and/or the length of the movement mechanism is kept as short as possible. Especially, it is typically preferred that the distance between the drive unit and/or the stepping gear and the substrate holder handling element is less than 50 cm, more preferred less than 30 cm, even more preferred less than 20 cm. Typically, it is especially preferred that the movement mechanism contains a stepping gear. Such movement mechanism allows to provide a reliable movement of the substrate holder handling element and to use basic drive units providing a high energy efficiency and high reliability.

The phrase "rotate around an axis essentially parallel to the surface of the substrate" as used herein refers to a rotation based on an axis only deviating slightly from an axis being parallel to the surface of a substrate placed into the substrate holder during the loading process in the substrate holder loading device. Preferably, said axis deviates less than 10°, more preferred less than 5°, even more preferred less than 2°, from such parallel axis. Typically, it is especially preferred that the axis is parallel to the surface.

The phrase "movement mechanism" as used herein refers to a subunit of the substrate holder loading device adapted to transmit the propulsion provided by the drive unit to the substrate holder handling element.

Surprisingly, it was noted that the inventive substrate holder loading device provided the best overall results taking into account the aforementioned object of the invention. Especially, it was noted that the inventive mechanical means including a stepping gear for moving the substrate holder provided great benefits. Contrary to the expectation that such mechanism would result in a particle contamination of the clean room atmosphere right next to the substrate said mechanism proved to be far superior compared to mechanisms like hydraulic, pneumatic or other mechanical mechanisms. Herein, it was, for example, noted that such a simply capsuled stepping gear significantly reduces or even prevent a contamination of the atmosphere, wherein said encapsulation can also be efficiently combined with a vacuum element to reduce any fine particles set free to close to zero or to even completely eliminate them. However, even without additional vacuum elements, it was noted that using such an encapsulated stepping gear is suited to fulfill high quality clean room requirements. Simultaneously, using such stepping gear allows to efficiently control the degree of rotation, while the drive unit can be, for example, selected from simple asynchronous motors being small in size, requiring less energy and providing a high life time and high reliability. Besides the surprising qualification of such mechanical moving components right next to the substrate in a clean room said means further provide the ability to handle a substrate holder handling element as specified herein. Taking into account the number of the mechanics, electronics and control devices that have to be included the weight of said substrate holder handling element becomes a relevant fact considering to ensure a safe operation. For typical substrate sizes the weight of the substrate holder handling element easily exceeds 100 kg.

It was further noted that typically used systems like hydraulic and pneumatic alternatives proved to be unfavourable on the long term run. They either did not provide the required precision, they required very complex controls to detect and balance deviations or a defect on the system resulted in great damages requiring at least long down times of the treatment device.

Furthermore, it was noted that placing the substrate holder horizontally allows providing a highly accurate placement of the substrate while reducing the stress applied on the substrate. Combined with the possibility to provide an accurate rotation by around 180° despite the high weight of the substrate holder handling element this substrate holder loading device provides a significant improvement.

Additionally, it was noted that the inventive substrate holder loading device proved to be especially beneficial to provide a modular system. Herein, the inventive substrate holder loading device allows to solely exchange the substrate holder handling element during maintenance or to provide a different type of substrate holder handling element for a different type of substrate holder. This becomes possible as most complex and specific parts can be included in the substrate holder handling element based on the possibility to accurately handle high weights with the inventive system. Especially including control mechanisms into the substrate holder handling element highly reduces the number of connections required and, thus, simplifies disconnecting and reconnecting such substrate holder handling element.

Although, an exact placement can also be accomplished by accurate movement of a device introducing a substrate holder into the substrate holder handling element it was noted that providing a substrate holder guiding elements is beneficial. Despite possible fine particles resulting from such mechanical contact it was noted such side effect can be neglected especially taking into account the reliability of this method. According to a further embodiment of the present invention the substrate holder guiding element is selected from the group of limit stops 19, which are adapted to contact the edge of the substrate holder, and protruding elements 20 adapted to fit into a counterpart 11 or 12 of the substrate holder 10.

Typically, it is especially preferred that the substrate holder guiding element contains at least one protruding element. This further provides the benefit that substrate holders of different sizes may be used, as the outer borders of the substrate holder becomes irrelevant for the accurate placement. Furthermore, the production of the substrate holder is simplified, as the counterpart in the substrate holder can be introduced at the end of the production process simplifying and decreasing the production costs of the substrate holder.

Furthermore, it was noted that specific opening mechanisms are typically beneficial. According to a further embodiment of the present invention the opening mechanism is based on mechanical, pressure or magnetic means. It was noted that an opening mechanism based on mechanical means proved to be especially useful.

Typically, it was further preferred that the movement mechanism of the substrate holder loading device only uses mechanical means to transfer the propulsion of the drive unit to the substrate holder handling element. It was noted that completely eliminating parts based on hydraulic or pneumatic means in the movement mechanism typically further increases the precision of the movement and allows higher movement speed.

Additionally, it was noted that the efficiency and reliability of the stepping gear can further be increased by selecting appropriate gears. According to a further embodiment of the present invention the input shaft of the stepping gear, the output shaft of the stepping gear, or both contain a globoid worm gear. Herein, already using a single globoid gear provides a significant improvement. However, it is especially preferred that both gears interacting are selected from globoid worm gears.

Furthermore, it was noted that the risk of particle contamination can further be reduced by using a specific kind of gripper to reversibly attach a part of the substrate holder while the substrate is placed in a different part of said substrate holder. According to a further embodiment of the present invention the substrate holder handling element contains a vacuum gripper to reversibly attach to a part of the substrate holder while the substrate is placed in a different part of the substrate holder.

Additionally, it was noted that it is typically preferred to include a pressing tool being especially beneficial if used together with a mechanical or magnetic opening mechanism. According to a further embodiment of the present invention the substrate holder loading device contains a pressing tool adapted to press at least two parts of the substrate holder together while the opening mechanism is active. In case of a mechanical opening mechanism providing such pressing tool is especially efficient, as it seems to further decrease the production of fine particles, as the parts of the substrate holder are pressed together and the release mechanism is less strained during the opening and closing of the substrate holder. Typically, it is preferred that the pressing tool contains a vacuum gripper adapted to reversibly attach a part of the substrate holder while the substrate is placed in the substrate holder.

Furthermore, it was surprisingly noted that the use of sliding elements proved to be helpful, although, such sliding element normally represent a further source of particle contamination. According to a further embodiment of the present invention the pressing tool contains at least one sliding element, wherein the at least one sliding element in is conjunction with, preferably contains, a vacuum element adapted to extract fine particles set free at the at least one sliding element. Typically, it is preferred that the substrate holder element contains at least two, more preferred at least three, even more preferred at least four, sliding elements being in conjunction with, preferably containing, such vacuum element. Although, such mechanical means should typically be avoided for a device to be used in a clean room it was noted that combining such sliding elements with vacuum elements to remove fine particles generated provide a very good balance of reliable and accurate movement of the pressure tool without endangering to contaminate the substrate.

Additionally, it was noted that no high vacuum seems to be required for removing the fine particles from the particles sources in the substrate holder handling element and, thus, a small vacuum pump with lower power could be used to remove the particles. Such small vacuum pump could be integrated into the substrate holder handling element. However, it was noted that it is typically preferred placing the vacuum pump outside the substrate holder handling element to reduce the weight of said element. Furthermore, the elimination of minor vibrations of the substrate holder handling element resulting from such vacuum pump seem to further improve the accurate placement. According to a further embodiment of the present invention the at least one vacuum element is connected to a vacuum pump located outside of the substrate holder handling element.

Furthermore, it was noted that including an outer shell providing a delimitation from the surroundings in a treatment device significantly increases the safety. According to a further embodiment of the present invention the substrate holder handling element contains an outer shell. Additionally, it was noted that such outer shell simplifies the replacement of said substrate holder handling element during maintenance based on the protection the outer shell offers for the interior components. The remaining components of the substrate holder loading device display a remarkable life time and reliability. Thus, the substrate holder handling element containing such means to easily exchange the complete unit containing all parts being most important to maintain provides a significant decrease of the downtime increasing the throughput.

Additionally, it was noted that the inventive substrate holder loading devices are surprisingly especially suitable for clean room treatment devices. According to another aspect the present invention refers to a clean room treatment device for wet treatment, wherein the clean room treatment device contains at least one inventive substrate holder loading device. Examples of such wet treatment are chemical metal deposition or electroplating, chemical or electrolytic etching and/or chemical cleaning. Especially preferred are clean room treatment devices for electroplating, chemical etching and or chemical cleaning, more preferred for electroplating. Such electroplating can be used to deposit, for example, copper, wherein such copper deposition can be beneficially performed by means of vertical deposition.

Furthermore, it was noted that including a robot arm provides a very efficient way to automate the substrate handling in a clean room treatment device in combination with the inventive substrate holder loading device. According to a further embodiment of the present invention the clean room treatment device contains at least one robot arm to transport a substrate from a cassette introduced into said clean room treatment device to the substrate holder loading device.

Additionally, it was noted that an aligner is beneficially included in the clean room treatment device. According to a further embodiment of the present invention the clean room treatment device contains at least one aligner adapted to align the substrate before it is placed into a substrate holder being in the substrate holder loading device. Providing such aligner allows a more accurate orientation of the substrate, which becomes especially useful in combination with the possibilities of the inventive substrate holder loading device.

Furthermore, it was noted that a touching gripper, especially a vacuum gripper, is especially suited for typical applications. Such gripper seems to be especially suited to provide the exact placement of the substrate. According to a further embodiment of the present invention the robot arm uses a touching gripper to transport the substrate from the aligner to the substrate holder loading device. Typically, it is preferred that such touching gripper is a vacuum gripper.

Additionally, it was noted that typically an especially efficient removal of fine particles resulting from the mechanical means can be achieved by guiding them outside the clean room treatment device. According to a further embodiment of the present invention the at least one vacuum element is connected to the outside of the clean room treatment device. That way it becomes possible to further connect the corresponding outlet of the clean room treatment device with the exterior of the clean room to reduce the fine particles set free in the clean room to close to zero or even zero.

According to another aspect the present invention refers to a method of loading a substrate holder with a first substrate using an inventive substrate holder loading device.

Furthermore, it was noted that the inventive substrate holder handling is especially suited to accurately place two substrates on opposite side of a substrate holder. According to a further embodiment of the present invention a second substrate is loaded onto the opposite side of the substrate holder, based on the location of the first substrate.

According to a further embodiment of the present invention the substrate holder handling element of the substrate holder loading device is rotated by around 180° before the second substrate is loaded onto the substrate holder. Such method provides very good results with regard to accurate placement of the two substrates while reducing the mechanical stress applied to the substrate.

According to a further embodiment of the present invention the inventive methods contains the steps of:

d) placing a first substrate on a substrate holder, e) fastening a first counterpart on top of the first substrate to the substrate holder, f) rotating the substrate holder by around 180° around an axis essentially parallel to a surface of the first substrate, i) placing a second substrate on the substrate holder, j) fastening a second counterpart on top of the second substrate to the substrate holder.

According to a further embodiment of the present invention the inventive method contains the steps of:

a) mounting a substrate holder into the substrate holder loading device, b) removing a first counterpart from the substrate holder, c) taking a substrate already contained in the substrate holder unfastened by removing the first counterpart if present out of the substrate holder, d) placing a first substrate on the substrate holder, e) fastening a first counterpart on top of the first substrate to the substrate holder, f) rotating the substrate holder by around 180° around an axis essentially parallel to a surface of the first substrate, g) removing a second counterpart from the substrate holder, h) taking a substrate already contained in the substrate holder unfastened by removing the second counterpart if present out of the substrate holder, i) placing a second substrate on the substrate holder, j) fastening a second counterpart on top of the second substrate to the substrate holder. It was noted that such methods allows providing a highly efficient loading process with high throughput. Herein, a loaded substrate holder coming, for example, from the treatment can be introduced into the substrate holder loading device. Substrates contained therein can be removed and a first and second substrate to be treated can be placed in the still open substrate holder. Thus, even if substrates are already present in the substrate holder the overall handling process is not changed much and the time required for loading remains comparable. This, for example, allows freely combining a high throughput process providing multiple simultaneously performed process steps with flexible replacement of single substrate holders for maintenance reasons or smoothly changing from one type of substrate holder to another.

According to a further embodiment of the present invention the placing of the first substrate and the second substrate in steps d) and i) is performed by using a touching gripper, more preferred a vacuum gripper, attached to a robot arm. Such gripper was typically preferred as it allows a very accurate handling of a substrate.

The following non-limiting examples are provided to illustrate preferred embodiments of the present invention and to facilitate understanding of the invention, but are not intended to limit the scope of the invention, which is defined by the claims appended hereto.

Figure 1:
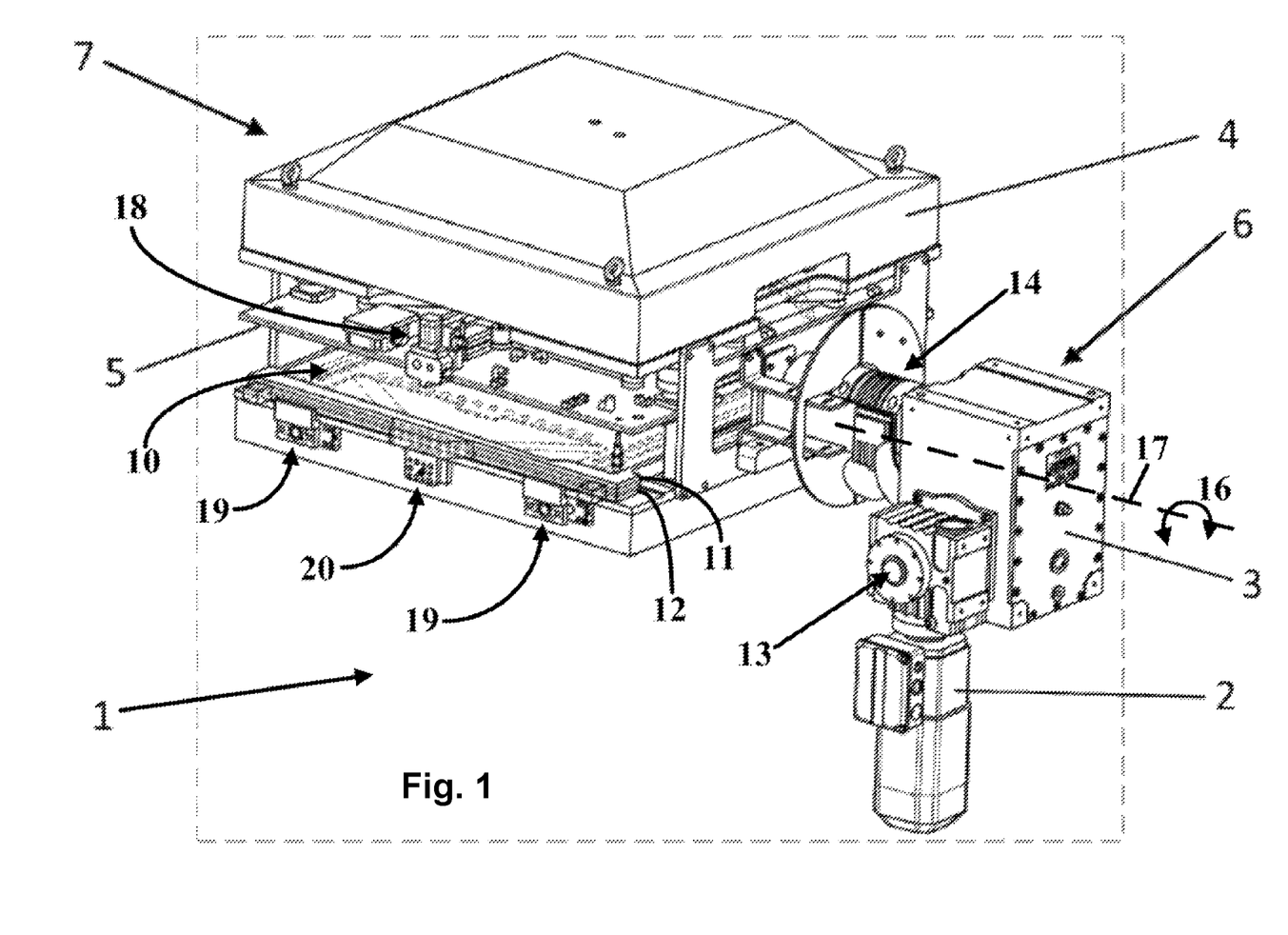
FIG. 1 shows a schematic perspective view of an inventive substrate holder loading device.

FIG. 1 shows a schematic perspective view of an inventive substrate holder loading device 1. Said substrate holder loading device 1 is adapted for automated horizontal loading of a substrate into a substrate holder 10 inside of a clean room. It contains a substrate holder guiding element 19 and 20, a drive unit 2, a movement mechanism 6, a substrate holder handling element 7 and an opening mechanism 18. The drive unit 2 being an asynchronous motor is connected to the movement mechanism 6 containing a stepping gear 3. The stepping gear 3 of the movement mechanism 6 contains an input shaft 13 and an output shaft 14, wherein both shafts contain a globoid worm gear, wherein said globoid worm gears interact to transfer the propulsion from the input shaft 13 to the output shaft 14. Such stepping gear 3 provides an especially efficient transfer of the propulsion and high lifetime.

Said movement mechanism 6 is further connected to the substrate holder handling element 7. The propulsion of the drive unit 2 is transmitted through the movement mechanism 6 to the substrate holder handling element 7 to provide a rotation 16 of 180° of the substrate holder handling element 7 along an axis 17 essentially parallel to the surface of the substrate. The substrate holder handling element 7 is adapted to reversibly fasten the substrate holder 10 and contains the opening mechanism 18 to automatically open and close the substrate holder 10 placed in the substrate holder handling element 7.

The interior of the substrate holder handling element 7 further provides a substrate holder guiding element 19 and 20 being a protruding element 20 adapted to fit into a counterpart 11 or 12 of the substrate holder 10. Furthermore, it contains an opening mechanism 18 based on mechanical means to automatically mechanically interact with a release mechanism of the substrate holder. Triggering said release mechanism detaches a counterpart 11 or 12 of the substrate holder 10 to allow a substrate to be placed inside of the substrate holder 10.

Furthermore, the substrate loader handling element 7 contains a vacuum gripper 1 to reversibly attach to a part of the substrate holder 10 while the substrate is placed in a different part of the substrate holder 10. Said vacuum gripper 1 is located at a pressing tool 5 adapted to press at least two parts of the substrate holder 1 together while the opening mechanism 18 is activated. Said pressing tool 5 contains four sliding elements located at the corners of the substrate holder handling element 7, wherein each sliding element provides a vacuum element adapted to extract fine particles set free at the sliding element. The vacuum elements are connected to a vacuum pump located outside of the substrate holder handling element 7. Additionally, the substrate holder handling element 7 contains an outer shell 4 surrounding the interior of the substrate holder handling element 7.

Figure 2:
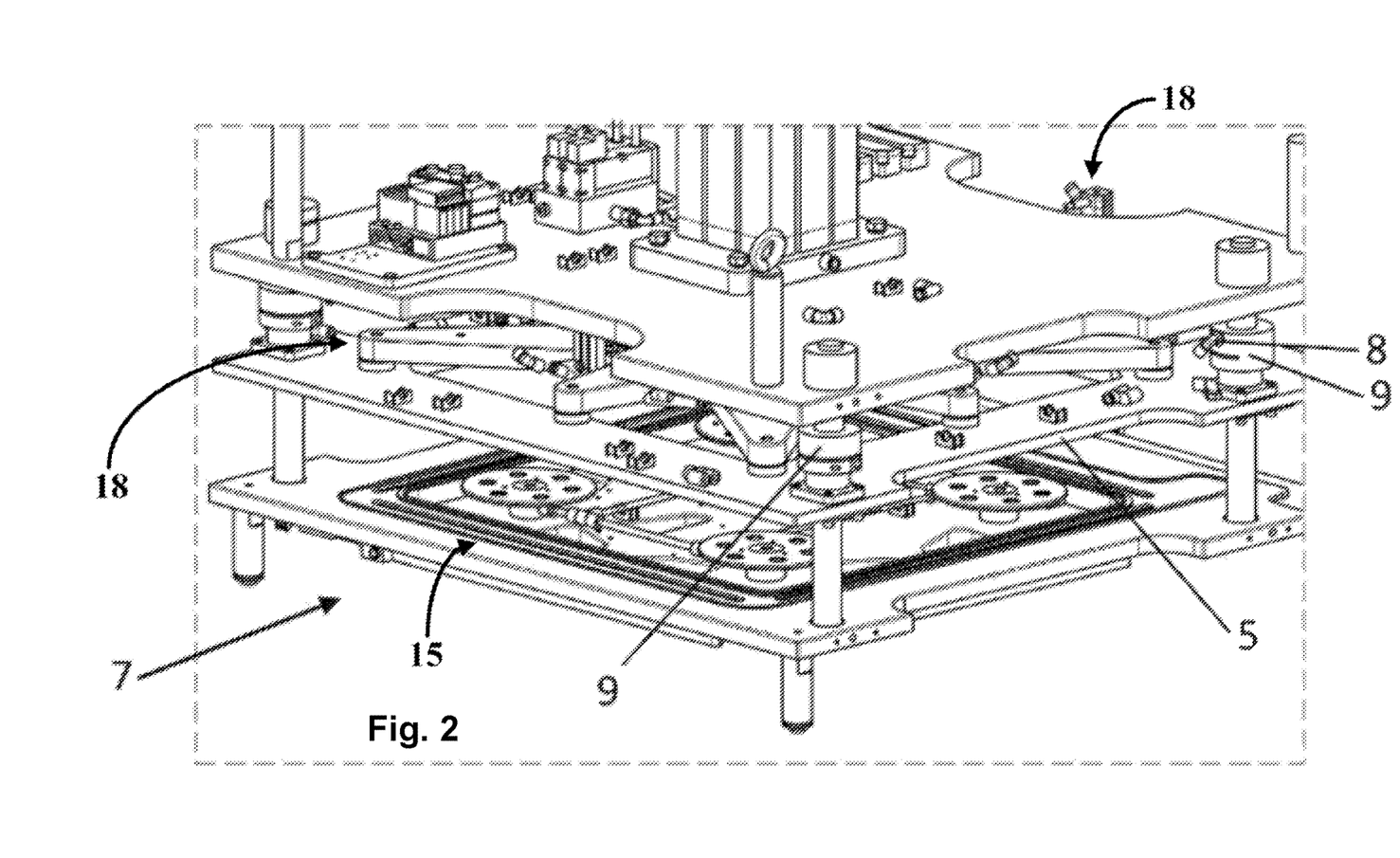
FIG. 2 shows a schematic perspective view of the interior of the substrate holder handling element of the substrate holder loading device of FIG. 1, wherein the pressing tool is open.

FIG. 2 shows a schematic perspective view of the interior of the substrate holder handling element 7 of the substrate holder loading device 1 of FIG. 1, wherein the pressing tool 5 is open. Herein, three of the four sliding elements 9 are visible and vacuum elements 8 attached to two sliding element are shown.

The pressing tool 5 of the substrate holder handling element 7 is in its open position as required to place a substrate holder 10 in the substrate holder handling element 7 or to place a substrate in an opened substrate holder 10.

Figure 3:
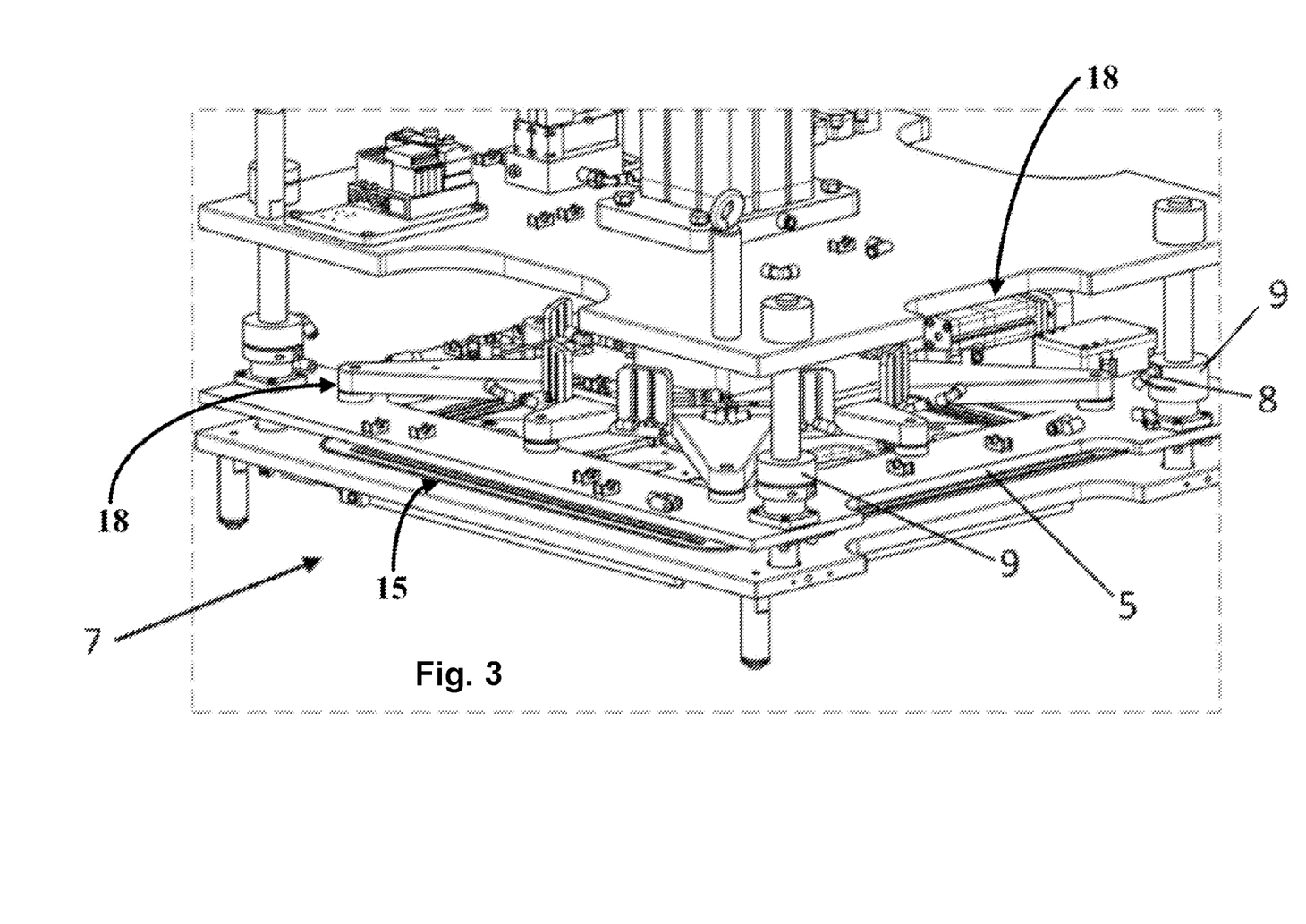
FIG. 3 shows a schematic perspective view of the interior of the substrate holder handling element of the substrate holder loading device of FIG. 1, wherein the pressing tool is lowered.

FIG. 3 shows a schematic perspective view of the interior of the substrate holder handling element 7 of the substrate holder loading device of FIG. 1, wherein the pressing tool 5 is lowered. The pressing tool 5 is moved along the four sliding elements 9, wherein the vacuum elements 8 remove fine particles resulting from the movement. The substrate holder 10 contained in the substrate holder handling element 7 is not shown to render the Figure clearer. In this position the parts of the substrate holder 10 are pressed together to more easily trigger a mechanical release mechanism of the substrate holder 10 and reduce the friction resulting from the movement of the mechanical elements.

REFERENCE SIGNS

1: substrate holder loading device
2: drive unit
3: stepping gear
4: outer shell
5: pressing tool
6: movement mechanism
7: substrate holder handling element
8: vacuum element
9: sliding element

The invention claimed is:

1. Substrate holder loading device,
wherein the substrate holder loading device contains a substrate holder guiding element, a drive unit, a movement mechanism, a substrate holder handling element, a pressing tool, and an opening mechanism,
wherein the drive unit is connected to the movement mechanism,
wherein the movement mechanism is connected to the substrate holder handling element,
wherein the movement mechanism is adapted to transmit the propulsion from the drive unit to the substrate holder handling element to provide a rotation of the substrate holder handling element along an axis essentially parallel to a surface of the substrate, wherein the substrate holder handling element is adapted to rotate by about 180°,
wherein the substrate holder handling element is adapted to reversibly fasten a substrate holder and wherein the substrate holder handling element contains the opening mechanism,
wherein the opening mechanism is adapted to automatically open and close the substrate holder, and
wherein the movement mechanism contains a stepping gear or wherein the drive unit is a step motor, or wherein both the movement mechanism contains a stepping gear and the drive unit is a step motor
wherein the pressing tool adapted to press at least two parts of the substrate holder together, wherein the pressing tool contains at least one sliding element, wherein the at least one sliding element is in conjunction with at least one vacuum element adapted to extract fine particles set free at the at least one sliding element.

2. Substrate holder loading device according to claim 1, wherein the at least one substrate holder guiding element is selected from the group of limit stops, which are adapted to contact the edge of the substrate holder, and protruding elements adapted to fit into a counterpart of the substrate holder.

3. Substrate holder loading device according to claim 1, wherein the opening mechanism is based on mechanical, pressure or magnetic means.

4. Substrate holder loading device according to claim 1, wherein the input shaft of the stepping gear, the output shaft of the stepping gear, or both contain a globoid worm gear.

5. Substrate holder loading device according to claim 1, wherein the substrate holder handling element contains a vacuum gripper to reversibly attach to a part of the substrate holder.

6. Substrate holder loading device according to claim 1, wherein the pressing tool is adapted to press at least two parts of the substrate holder together while the opening mechanism is active.

7. Substrate holder loading device according to claim 1, wherein the substrate holder handling element contains an outer shell.

* * * * *